United States Patent
Shcheglov et al.

(10) Patent No.: US 10,352,960 B1
(45) Date of Patent: Jul. 16, 2019

(54) FREE MASS MEMS ACCELEROMETER

(71) Applicant: Garmin International, Inc., Olathe, KS (US)

(72) Inventors: Kirill V. Shcheglov, Duarte, CA (US); Yingxiang Cheng, Goleta, CA (US); Nolan F. Maggipinto, Santa Barbara, CA (US)

(73) Assignee: Garmin International, Inc., Olathe, KS (US)

( * ) Notice: Subject to any disclaimer, the term of this patent is extended or adjusted under 35 U.S.C. 154(b) by 164 days.

(21) Appl. No.: 15/337,572

(22) Filed: Oct. 28, 2016

Related U.S. Application Data

(60) Provisional application No. 62/248,904, filed on Oct. 30, 2015.

(51) Int. Cl.
*G01P 15/13* (2006.01)
*G01P 15/125* (2006.01)
*G01P 15/08* (2006.01)

(52) U.S. Cl.
CPC ...... *G01P 15/125* (2013.01); *G01P 2015/082* (2013.01); *G01P 2015/0854* (2013.01)

(58) Field of Classification Search
CPC ............ G01C 19/5642; G01C 19/5635; G01C 19/5762; G01C 19/5719; G01P 2015/088; G01P 2015/0882; G01P 15/14; G01P 15/125; G01P 15/13; G01P 15/131; G01P 2015/0845; G01P 15/133
See application file for complete search history.

(56) References Cited

U.S. PATENT DOCUMENTS

| | | | | |
|---|---|---|---|---|
| 5,767,405 | A * | 6/1998 | Bernstein | G01C 19/5719 73/504.12 |
| 5,914,553 | A * | 6/1999 | Adams | G01P 1/006 310/309 |
| 5,992,233 | A * | 11/1999 | Clark | G01C 19/5719 361/280 |
| 6,065,341 | A * | 5/2000 | Ishio | B81B 3/0051 361/283.3 |
| 6,079,272 | A | 6/2000 | Stell | |
| 6,082,197 | A * | 7/2000 | Mizuno | G01P 15/0802 73/514.32 |
| 6,230,563 | B1 * | 5/2001 | Clark | G01C 19/5719 73/504.04 |

(Continued)

FOREIGN PATENT DOCUMENTS

WO    WO 2005/100237    10/2005

OTHER PUBLICATIONS

U.S. Appl. No. 15/337,436, Shcheglov, filed Oct. 28, 2016.
(Continued)

*Primary Examiner* — Harshad R Patel
*Assistant Examiner* — Tran M. Tran
(74) *Attorney, Agent, or Firm* — Samuel M. Korte; Max M. Ali

(57) ABSTRACT

A MEMS accelerometer incorporating a metrology element to directly measure minute changes in measurement baseline. In particular, the MEMS accelerometer incorporates a metrology bar (MB). Embodiments also relate to stress isolation into the sensor design to isolate the sensitive areas of the chip (i.e., the metrology baseline and the proof mass mounting points) from outside stress.

24 Claims, 4 Drawing Sheets

(56) References Cited

U.S. PATENT DOCUMENTS

| | | | |
|---|---|---|---|
| 6,276,207 B1* | 8/2001 | Sakai | B81B 3/0008 73/514.16 |
| 6,360,601 B1 | 3/2002 | Challoner | |
| 6,367,786 B1 | 4/2002 | Gutierrez | |
| 6,393,913 B1* | 5/2002 | Dyck | G01P 15/0802 333/186 |
| 6,439,051 B2 | 8/2002 | Kikuchi | G01C 19/5607 73/504.12 |
| 6,467,346 B1 | 10/2002 | Challoner | |
| 6,584,845 B1 | 7/2003 | Gutierrez | |
| 6,598,455 B1 | 7/2003 | Raevis | |
| 6,675,630 B2 | 1/2004 | Challoner | |
| 6,796,179 B2 | 9/2004 | Bae | |
| 6,823,734 B1 | 11/2004 | Hayworth | |
| 6,845,670 B1* | 1/2005 | McNeil | G01P 15/125 73/510 |
| 6,882,964 B2 | 4/2005 | Bayard | |
| 6,915,215 B2 | 7/2005 | M'Closkey | |
| 6,944,931 B2 | 9/2005 | Shcheglov | |
| 6,955,084 B2 | 10/2005 | Challoner | |
| 6,990,863 B2 | 1/2006 | Challoner | |
| 7,017,410 B2 | 3/2006 | Challoner | |
| 7,040,163 B2 | 5/2006 | Shcheglov | |
| 7,159,441 B2 | 1/2007 | Challoner | |
| 7,168,318 B2* | 1/2007 | Challoner | G01C 19/5684 73/504.12 |
| 7,210,350 B2* | 5/2007 | Ogura | G01C 19/5607 73/504.12 |
| 7,267,006 B2* | 9/2007 | Malvern | G01P 1/006 73/514.32 |
| 7,285,844 B2 | 10/2007 | Hayworth | |
| 7,368,861 B2* | 5/2008 | Tanaya | G01C 19/5607 310/370 |
| 7,401,397 B2* | 7/2008 | Shcheglov | G01C 19/5684 29/592.1 |
| 7,412,885 B2* | 8/2008 | Ogura | G01C 19/5607 310/370 |
| 7,412,887 B2* | 8/2008 | Memishian | G01P 15/125 73/514.01 |
| 7,437,253 B2 | 10/2008 | Shcheglov | |
| 7,464,592 B2* | 12/2008 | Ohta | G01P 1/006 73/504.17 |
| 7,552,638 B2* | 6/2009 | Menard | G01P 15/131 73/514.18 |
| 7,637,160 B2* | 12/2009 | Koury, Jr. | B81B 3/0094 73/514.32 |
| 7,640,786 B2* | 1/2010 | Stewart | G01P 15/08 73/1.38 |
| 7,640,803 B1* | 1/2010 | Gutierrez | G01C 19/5719 73/504.04 |
| 7,690,254 B2* | 4/2010 | Pilchowski | G01C 19/5719 73/504.14 |
| 7,793,541 B2* | 9/2010 | Challoner | G01C 19/5684 73/493 |
| 7,818,871 B2 | 10/2010 | Shcheglov | |
| 7,980,115 B2* | 7/2011 | Stewart | G01P 21/00 73/1.38 |
| 8,011,246 B2* | 9/2011 | Stewart | G01C 19/5719 73/1.37 |
| 8,053,957 B2* | 11/2011 | Sugiyama | H03H 3/02 310/344 |
| 8,158,448 B2* | 4/2012 | Ge | G01C 19/5684 257/E21.214 |
| 8,186,221 B2* | 5/2012 | Lin | B81B 7/0074 73/493 |
| 8,220,330 B2* | 7/2012 | Miller | B81B 7/02 73/493 |
| 8,393,212 B2* | 3/2013 | Ge | G01C 19/5684 73/504.12 |
| 8,418,554 B2* | 4/2013 | Joyce | G01C 19/5663 73/504.15 |
| 8,443,671 B2* | 5/2013 | Classen | B81B 3/0072 438/50 |
| 8,453,503 B2* | 6/2013 | Oshio | G01C 19/5642 73/504.12 |
| 8,549,915 B2* | 10/2013 | Schofield | G01C 19/56 73/504.12 |
| 8,584,522 B2* | 11/2013 | Acar | G01C 19/5712 73/504.12 |
| 8,659,101 B2* | 2/2014 | Yamanaka | G01C 19/5783 257/415 |
| 8,689,633 B2* | 4/2014 | Classen | B81B 7/02 73/510 |
| 8,752,430 B2* | 6/2014 | Burghardt | G01P 15/125 73/510 |
| 8,766,745 B1* | 7/2014 | Kubena | H03H 3/0072 333/186 |
| 9,046,541 B1* | 6/2015 | Kubena | H03H 3/0072 |
| 9,075,079 B2* | 7/2015 | Yoneoka | G01C 19/5762 |
| 9,246,017 B2* | 1/2016 | van der Heide | H01L 29/84 |
| 9,360,496 B2* | 6/2016 | Naumann | G01P 15/18 |
| 9,547,020 B2* | 1/2017 | Liukku | B81B 3/0078 |
| 10,161,957 B2* | 12/2018 | Townsend | G01P 15/131 |
| 2015/0168146 A1* | 6/2015 | Shcheglov | G01C 19/5733 73/504.13 |
| 2015/0301075 A1* | 10/2015 | Yamanaka | G01P 15/125 73/1.38 |
| 2016/0033273 A1* | 2/2016 | Kamisuki | G01P 15/125 73/504.12 |
| 2016/0047839 A1* | 2/2016 | Tanaka | G01P 15/125 73/514.32 |
| 2016/0084872 A1* | 3/2016 | Naumann | G01P 15/125 73/514.32 |
| 2016/0169931 A1* | 6/2016 | Tocchio | G01C 19/5712 73/514.01 |
| 2017/0074653 A1* | 3/2017 | Kanazawa | G01C 19/5621 |

OTHER PUBLICATIONS

U.S. Appl. No. 15/337,480, Shcheglov, filed Oct. 28, 2016.
U.S. Appl. No. 15/337,627, Shcheglov, filed Oct. 28, 2016.
U.S. Appl. No. 15/337,681, Shcheglov, filed Oct. 28, 2016.

* cited by examiner

FREE MASS MEMS ACCELEROMETER

PRIORITY CLAIM

The present application claims priority to U.S. Provisional Patent Application Ser. No. 62/248,904, filed Oct. 30, 2015, entitled "Free Mass MEMS Accelerometer," the entirety of which is hereby incorporated by reference.

BACKGROUND

1. Field

The present disclosure relates generally to micro-electromechanical sensors (MEMS). More particularly, the present disclosure relates to MEMS accelerometers.

2. Related Art

Mechanical accelerometers are used to sense acceleration. In various forms accelerometers are often employed as a critical sensor for vehicles, such as aircraft and automobiles. They are generally useful for navigation, stabilization, crash sensing, and pointing or whenever it is necessary to autonomously determine the acceleration or motion of a free object.

A typical electromechanical accelerometer includes a mass on a spring and readout electronics. The readout electronics are typically in close proximity to the proof mass, and are internally mounted to a case which also provides the electrical feed-through connections to the platform electronics and power supply.

Older conventional mechanical accelerometers were very heavy mechanisms by current standards, employing relatively large masses. Existing MEMS (micro-electro-mechanical systems) accelerometers, on the other hand, utilize small masses with small electrodes.

Currently, the spring stiffness is chosen such as to ensure a displacement at a maximum applied survivable acceleration below the motion clearance of the mass. For high precision operation, a force rebalance loop is typically employed to maintain the position of the mass at a fixed location set point, and the applied restoring force is then a direct measure of acceleration. The main source of bias error in such a system, assuming perfect sensing and control electronics, is the change in the measurement baseline, i.e. the shift of the spring attachment position relative to the mass set point position.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the invention relate to a MEMS accelerometer that incorporates a metrology element, such as a metrology bar (MB), which is employed to directly measure the minute changes in measurement baseline. Embodiments of the invention also relate to stress isolation in the sensor design to isolate the sensitive areas of the resonator.

According to one aspect of the invention, an accelerometer is disclosed that includes a resonator comprising a plurality of slots arranged in a symmetrical pattern, the resonator configured to move upon excitation; at least one excitation electrode within at least one of the plurality of slots of the planar resonator to excite movement of the planar resonator; at least one sensing electrode within at least one of the plurality of slots of the planar resonator for sensing the movement; a metrology bar within at least one of the plurality of slots, the metrology bar configured for measuring the average distance change of the at least one sensing electrode.

According to another aspect of the invention, an accelerometer is disclosed that includes a resonator body having a central mounting point; a plurality of slot openings in the resonator body, wherein the plurality of slot openings are symmetrically arranged in the resonator body; an excitation electrode in at least one of the plurality of slot openings; a sensing electrode in at least one of the plurality of slot openings, wherein the excitation electrode and the sensing electrode together comprise a drive/sense electrode pair; and a metrology bar in at least one of the plurality of slot openings.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

DETAILED DESCRIPTION

In the following description of embodiments of the invention, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Embodiments of the invention achieve bias stability and sensitivity previously only achievable in large accelerometers and seismometers in a miniature MEMS die.

As explained in the Background, current accelerometer technology utilizes a mass on the spring to sense acceleration, and a force rebalance loop is typically employed to maintain the position of the mass at a fixed location set point, and the applied restoring force is then a direct measure of acceleration. The main source of bias error in such a system, assuming perfect sensing and control electronics, is the change in the measurement baseline, i.e. the shift of the spring attachment position relative to the mass set point position. This shift typically occurs when the mounting stress changes with temperature due to thermal mismatch of the die, die attach and package materials, or relaxes due to aging or thermal cycling. The resulting acceleration error is calculated to be $\Delta a=\omega^2 \Delta x$ where $\omega$ is the resonance angular frequency, and $\Delta x$ is the change in the measurement baseline. On one hand, to survive 100 g shocks in an unpowered state, the natural frequency of the system has to be above 2 kHz. On the other hand, to minimize bias, as low a frequency as possible is desired. An ideal accelerometer has a natural frequency of 0, i.e. an unattached free mass, and consequently having no bias errors stemming from the mounting.

Figure 1:
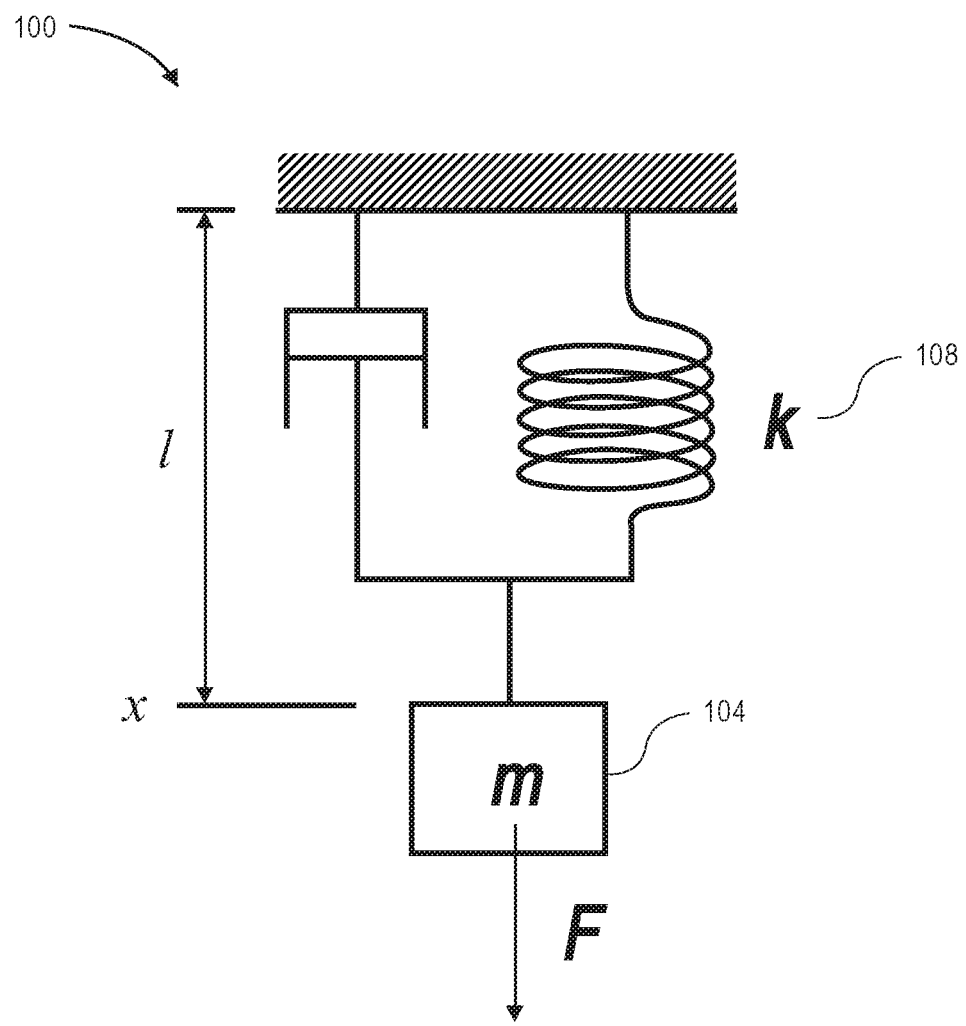
FIG. 1 is a schematic drawing of a linear model of an accelerometer.

FIG. 1 illustrates a linear model of the accelerometer 100. The accelerometer is a mass 104 on a spring 108. Using the Newton's laws of motion and the spring equation, x=F/k; F=m*a; $\omega^2$=k/m (where F is force, k is the spring constant, m is the mass and a is acceleration), the displacement as a function of applied acceleration is: $x=a/\omega^2$; $\Delta a=\Delta x*\omega^2$. In open loop operation, the resulting measurement error is $\Delta a=\Delta/\omega^2+1 \ \Delta k/m$; in close loop operation, the resulting measurement error is $\Delta a=\Delta l \omega^2$, where l is the distance to the electrodes from the center point.

There are three was to reduce the bias:
1. Independently measure l and compensate for the resulting bias (independent metrology element)
2. Reduce $\Delta l$ (stress isolation)
3. Reduce $\omega^2$ (lower natural frequency via, for example, electrostatic spring softening).

To address the mounting stress bias error, embodiments of the invention employ a dual approach. In some embodiments, a metrology element is incorporated into the accelerometer to independently measure/and compensate for bias. In some embodiments, stress isolation is incorporated into the accelerometer to reduce $\Delta l$. Embodiments of the invention also incorporate both the metrology element and stress isolation.

Metrology Bar

Figure 2:
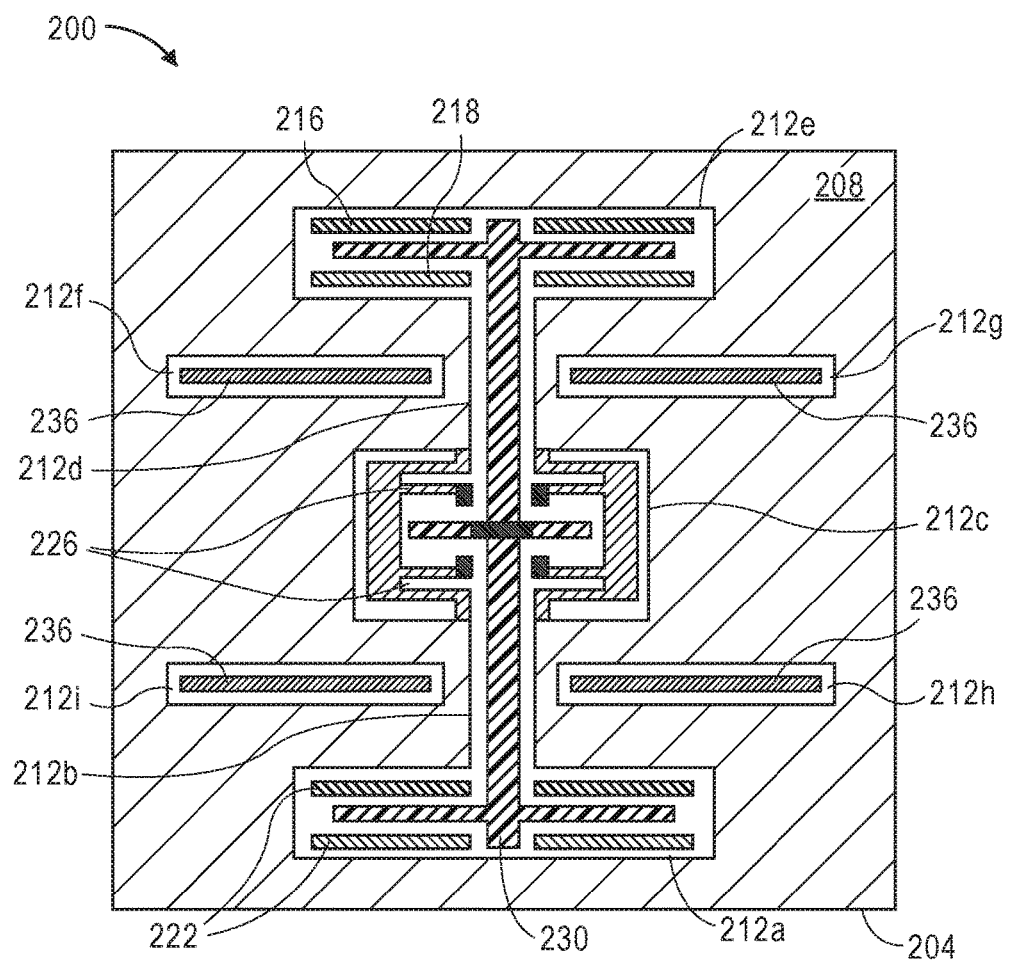
FIG. 2 is a perspective view schematic of an accelerometer device in accordance with one embodiment of the invention.

FIG. 2 illustrates a schematic of an accelerometer design according to embodiments of the invention. The accelerometer design shown in FIG. 2 is an inertial sensor that is used to determine motion, such as acceleration, of a moving platform by sensing the inertial reaction of a proof mass. The planar resonator accelerometer shown in FIG. 2 may be micro-machined.

The accelerometer 200 includes a resonator 204, which includes a proof mass 208. The proof mass 208 acts as an integral proof mass of the resonator. Although the proof mass 208 is illustrated as a square, it will be appreciated that other geometries are also possible using the principles of this invention. In FIG. 2, the proof mass 208 is depicted as consisting of four symmetrical quadrants (208a-d); however, it will be appreciated that the quadrants are merely illustrative of the symmetrical design and that the proof mass 208 is a single body.

The proof mass 208 includes a plurality of openings or slots 212a-212i. The slots or openings 212a-212i are sized such that electrodes 216, 218, which are discussed below, can be formed in the openings or slots 212a-212i and will depend on the manufacturing process and materials used to form the electrodes. As shown in FIG. 2, the openings 212a-212i are formed as five separate but distinct openings—a first, central opening consisting of several discrete openings (212a-e), and four additional openings (212f-i) symmetrically positioned around the first, central opening (212a-e). The central opening is shown as one single, symmetrical opening that includes two identical, opposing large slots 212a, 212e, a central slot 212c and two connecting slots 212b, 212d. It will be appreciated that the precise arrangement of the slots and the size of the slots may vary from that shown in FIG. 2. The size of the slots 212a-i may be any value or range of values between about 5-200 μm wide. It will be appreciated however that the size may be less than 5 μm or greater than 200 μm.

The resonator 204 further includes at least one sensing electrode 216 and at least one forcing or excitation electrode 218 embedded in the slots or openings of the resonator body 204. Together one sensing electrode 216 and one excitation electrode from a drive/sense electrode pair 222. Typically, each resonator 204 includes multiple drive/sense electrode pairs 222 as shown for example in FIG. 2. Each excitation electrode further includes a positive excitation element and a negative excitation element. The paired excitation elements 218 are driven to excite the proof mass 208. The sensing electrodes 216 also likewise include positive sensing elements and negative sensing elements which together provide output regarding motion of the proof mass 208.

The resonator 204 also includes spring flexures 226 in the openings. The thickness of the spring flexures 226 may be any value or range of values between about 1-10 μm; it will be appreciated that they may be greater than 10 μm. The spring flexures 226 impact the compliance of the resonator body 101, and thus the amount of movement that can be induced and sensed by the accelerometer. It will be appreciated that the number of spring flexures 226 may differ from that shown in FIG. 2.

The arrangement and distribution of the excitation and sensing electrodes 216, 218 can be varied as desired, however, placement of the electrodes will vary depending on SNR and dynamic range requirements. This aspect constitutes one of the ways the design can be scaled to meet varying sensor needs. For example, accelerometer applications for measuring gravity (i.e. inclinometer) may have a different placement of electrodes than accelerometer applications for measuring accelerations that have more variance. The placement of the electrodes changes the capacitance and thus impacts the changes in capacitance that can be sensed by the electrodes.

In one embodiment, the sensing electrodes 216 are used to sense the displacement of the proof mass 208 due to applied acceleration. The excitation electrodes 218 are then energized such that the displacement is zeroed out and the mass 204 is returned to its nominal position. The force applied by the excitation electrodes 218 required to keep the proof mass 208 from moving is directly related to the applied acceleration. In another embodiment, the excitation electrodes 218 within the resonator 204 are driven to induce movement in the proof mass 208. Movement of the platform to which the accelerometer 200 is attached causes changes in the movement of the resonator 204. The sensing electrodes 216, also within the resonator 204, sense these changes in movement of the proof mass 208 as a measurement of force. The acceleration corresponding to the movement can then be determined from the force measurement.

In embodiments of the invention, the resonator 204 further includes a sensing baseline metrology bar 230. The metrology bar (MB) 230 is employed to directly measure minute changes in measurement baseline. The metrology bar 230 provides an independent reference of the drive/sense electrode position relative to the mounting point. In particular, the metrology bar 230 measures the average distance change to the drive/sense (DS) electrode pair 222.

In general, the metrology bar is made of the same material that the proof mass and the electrodes are made of. In one embodiment, they are all made from silicon. Other exemplary materials include other dimensionally stable materials, such as fused silica, low expansion glass and the like. The metrology bar 230 is wired to a separate set of sense electronics which provide for the DS electrode position readout; alternatively, the same sensing electrodes 216 can measure the position difference.

As shown in FIG. 2, the metrology bar 230 is attached at the center of the resonator 204 and the metrology bar 230 is a T-shaped element. It will be appreciated however that the metrology bar 230 may have other shapes. For example, the metrology bar 230 may have additional bars extending from it. Additionally, the metrology bar 230 is shown as having the same thickness as the sensing and excitation electrodes 216, 218, respectively; however, it will be appreciated that the thickness of the metrology bar 230 may be less than or greater than the thickness of the sensing and excitation electrodes 216, 218.

As explained above, the metrology bar 230 provides an independent reference of the drive/sense electrode pair 222 position relative to the mounting point. More specifically, the metrology bar 230 is used as an independent measure of the position of the sensing electrode(s) 216 relative to the center mounting point of the metrology bar 230 to the resonator 204. The same set of sensing electrodes 216 may be used to measure the position of the proof mass 208 and the metrology bar 230. The proof mass 208 is free to move; the metrology bar 230 is not. Any apparent motion of the metrology bar 230 constitutes a shift of the position of the sensing electrodes 216.

The resonator 204 may further include tuning electrodes 236. The tuning electrodes 236 can be used to lower the natural frequency (spring constant) of the resonator 204. Given sufficient tuning authority the resonant frequency may be tuned all the way to 0 Hz thus producing a sensor with an effectively free mass element. This may be advantageous where accelerations are small—the acceleration inputs may be integrated by the element itself up to some small displacement limit, thus bypassing some of the errors inherent in electronic and numerical integration of the acceleration input to calculate position. It is also possible, given a pair of such accelerometers, to continuously use at least one in a self-integrating mode while the other's mass position is being reset. Lowering the natural frequency of the resonator 204 using the tuning electrodes 236 directly reduces the $\Delta a = \Delta l \omega^2$ bias term by reducing $\omega^2$. In addition, the spring constant (and consequently $\omega^2$) can be modulated to extract the $\Delta l$ thus providing another independent measurement of the bias-causing stress asymmetry.

Accelerometer Stress Isolation

Figure 3:
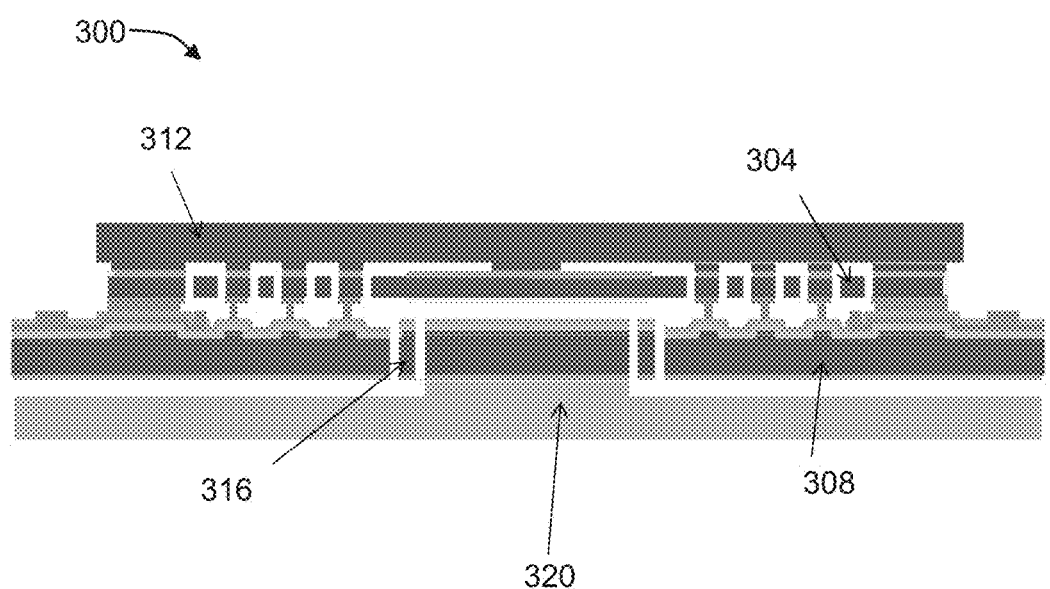
FIG. 3 is a cross section view showing stress isolation built into the supporting wafer of the accelerometer device in accordance with one embodiment of the invention.

FIG. 3 shows a cross section of the accelerometer device. As shown in FIG. 3, the accelerometer device 300 includes a device wafer 304. In some embodiments, the device wafer 304 is the accelerometer 200 described above with reference to FIG. 2. The accelerometer device 300 further includes an electrical mounting wafer 308 and a mechanical wafer 312. The electrical wafer 308 includes the electrical connections between the resonator wafer 304 and the control electronics. The device wafer 304 is bonded to the electrical mounting wafer 308 at the die attach areas 316. The accelerometer device 300 may further include an optional thermal and stress isolating interposer 320. As explained in further detail with reference to FIG. 4, the electrical mounting wafer 308 and/or the stress isolating interposer 320 may incorporate stress isolation features to isolate sensitive areas of the chip (i.e., the metrology baseline and the proof mass mounting points) from outside stress caused by the thermal mismatch of the die, die attach and package materials or the relaxing due to aging or thermal cycling. As explained above, stresses propagating into the resonator have a detrimental and unpredictable effect on accelerometer performance (bias). To better isolate the active portion of the sensor from the mounting stresses propagating through the proof mass attachment center area, the stress isolation scheme alternates concentric, symmetric regions of high stiffness and low stiffness, as shown in FIG. 4.

Figure 4:
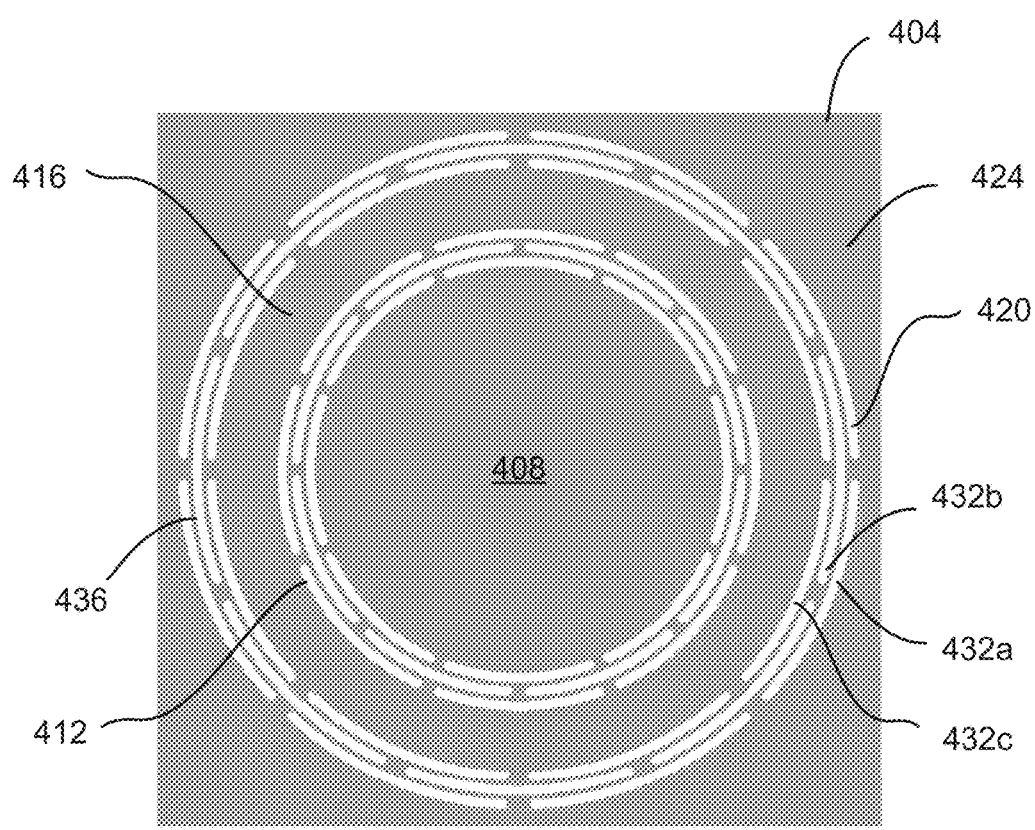
FIG. 4 is a schematic view illustrating stress isolation of the die attach area on the mounting wafer in accordance with one embodiment of the invention.

As shown in FIG. 4, the accelerometer utilizes two pairs of high stiffness/low stiffness areas. In particular, as shown in FIG. 4, the wafer 404 includes a central stiff die attach area 408. The central stiff die attach area is surround by a first soft (or low stiffness) region 412. A first stiff region 416 surrounds the first soft region 412. A second soft region 420 surrounds the first stiff region 416, and a second stiff region 424 surrounds the second soft region 420. It will be appreciated that fewer than or more than two soft regions may be incorporated into the wafer 404; likewise, fewer than or more than two stiff regions may be incorporated into the wafer 404. As shown in FIG. 4, each of the first and second soft regions 412, 420 include three annular rings 432a-c of circumferential slot elements 436. It will be appreciated that the soft region may incorporate fewer than or more than three annular rings. Each of the three annular rings 432 is shown as having eight slot elements 436; it will also be appreciated that the annular rings may include fewer than or more than eight slot elements.

Since the bending stiffness of a beam scales as thickness cubed, a pair of rings 1× and 10 in width would reduce the asymmetric stress by a factor of 1,000 (while reducing the symmetric component by a factor of 10. Consequently, the configuration shown in FIG. 4 reduces the stress asymmetry propagated into the active structure by a factor of $10^6$.

The invention has been described in relation to particular examples, which are intended in all respects to be illustrative rather than restrictive. Those skilled in the art will appreciate that many different combinations will be suitable for practicing the present invention. Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. An accelerometer comprising:
    a die package;
    a planar resonator positioned within the package;
    a plurality of slots within the resonator;
    a metrology bar having a fixed location on the resonator, the metrology bar having at least one portion thereof positioned within at least one of the plurality of slots of the resonator;
    a proof mass having a nominal position and configured to move from the nominal position upon excitation; and
    at least one excitation electrode positioned proximate to the at least one portion of the metrology bar within the at least one of the plurality of slots of the resonator, the at least one excitation electrode configured to output a force causing movement of the proof mass to its nominal position;
    wherein the force output by the at least one excitation electrode to move the proof mass to its nominal position corresponds to an acceleration of the die package.

2. The accelerometer of claim 1, wherein the metrology bar is centrally located in the resonator.

3. The accelerometer of claim 1, further comprising at least one sensing electrode positioned proximate to the at least one portion of the metrology bar within the at least one of the plurality of slots of the resonator; wherein the at least one sensing electrode is separated from the proof mass by a separation distance, the separation distance changing based on the movement of the proof mass; wherein the separation distance corresponds to an acceleration of the die package.

4. The accelerometer of claim 3, wherein the at least one excitation electrode and the at least one sensing electrode form a drive/sense electrode pair.

5. The accelerometer of claim 3, wherein a sensor structure is formed by the die package, the proof mass, the at least one excitation electrode, and the at least one sensing electrode.

6. The accelerometer of claim 1, wherein the at least one of the plurality of slots comprises spring flexures.

7. The accelerometer of claim 1, wherein the movement of the proof mass comprises in-plane lateral motion about a central mounting point of the metrology bar.

8. The accelerometer of claim 1, wherein the metrology bar comprises a T-shaped element.

9. The accelerometer of claim 1, further comprising a plurality of tuning electrodes configured to lower a natural frequency of the accelerometer.

10. The accelerometer of claim 1, wherein the accelerometer further comprises:
a mechanical wafer,
an electrical mounting wafer, and
a proof mass wafer mounted between the mechanical wafer and the electrical mounting wafer at a central attachment area of the die package.

11. The accelerometer of claim 10, further comprising a thermal and stress isolating interposer connected to the electrical mounting wafer.

12. The accelerometer of claim 10, wherein the electrical mounting wafer comprises a plurality of alternating regions of high and low stiffness to isolate the die package from external stress.

13. The accelerometer of claim 1, wherein the plurality of slots are arranged in a symmetrical pattern within the proof mass.

14. An accelerometer comprising:
a die package;
a planar resonator positioned within the die package;
a metrology bar having a central mounting point within the planar resonator;
a proof mass having a nominal position and configured to move from the nominal position upon excitation;
a plurality of slot openings in the proof mass, the plurality of slot openings arranged symmetrically in the proof mass;
an excitation electrode positioned in at least one of the plurality of slot openings, the excitation electrode configured to output a force causing movement of the proof mass to its nominal position; and
a sensing electrode positioned in at least one of the plurality of slot openings;
wherein the force output by the at least one excitation electrode to move the proof mass to its nominal position corresponds to an acceleration of the die package; and
wherein at least one portion of the metrology bar is positioned in at least one of the plurality of slot openings in which the excitation electrode and the sensing electrode are positioned.

15. The accelerometer of claim 14, wherein the excitation electrode and the sensing electrode together form a drive/sense electrode pair; and wherein the metrology bar measures the relative movement of the drive/sense electrode pair.

16. The accelerometer of claim 14, wherein the metrology bar is a T-shaped element.

17. The accelerometer of claim 14, further comprising at least one tuning electrode in at least one of the plurality of slot openings.

18. The accelerometer of claim 14, wherein the plurality of slot openings comprise spring flexures.

19. The accelerometer of claim 14, wherein movement of the proof mass is measured using the sensing electrode and used to measure a compliance and damping of a support and utilized to compensate for measurement errors due to changes in compliance and damping, and wherein the metrology bar is used to measure an average distance change between the metrology bar and the excitation electrode and the sensing electrode.

20. The accelerometer of claim 14, further comprising a mechanical wafer and an electrical mounting wafer bonded to the planar resonator, and wherein the electrical mounting wafer supports the metrology bar at the central mounting point.

21. The accelerometer of claim 20, further comprising a thermal and stress isolating interposer, the mounting wafer supported by the thermal and stress isolating interposer.

22. The accelerometer of claim 20, wherein the mounting wafer comprises at least two concentric symmetric regions of high and low stiffness to isolate stresses from propagating into the die package around the central mounting point.

23. The accelerometer of claim 14, wherein a sensor structure is formed by the die package, the proof mass, the at least one excitation electrode, and the at least one sensing electrode.

24. The accelerometer of claim 14, wherein the sensing electrode is separated from the metrology bar by a separation distance between the sensing electrode and the proof mass, the separation distance changing based on the movement of the proof mass; and wherein the separation distance corresponds to an acceleration of the die package.

* * * * *